(12) United States Patent
Fischer

(10) Patent No.: US 7,371,685 B2
(45) Date of Patent: May 13, 2008

(54) LOW STRESS BARRIER LAYER REMOVAL

(75) Inventor: Paul Fischer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 62 days.

(21) Appl. No.: 10/794,738

(22) Filed: Mar. 3, 2004

(65) Prior Publication Data
US 2005/0196956 A1    Sep. 8, 2005

(51) Int. Cl.
*H01L 21/302* (2006.01)
(52) U.S. Cl. ............... 438/690; 257/E21.239
(58) Field of Classification Search ......... 438/633, 438/692, 690; 257/E21.239
See application file for complete search history.

(56) References Cited

U.S. PATENT DOCUMENTS

| | | | | |
|---|---|---|---|---|
| 5,591,068 | A * | 1/1997 | Taylor | 451/104 |
| 6,630,433 | B2 * | 10/2003 | Zhang et al. | 510/175 |
| 6,719,611 | B2 * | 4/2004 | Kordonski et al. | 451/36 |
| 7,217,655 | B2 * | 5/2007 | Cabral et al. | 438/642 |
| 2003/0015793 | A1 * | 1/2003 | Merchant et al. | 257/734 |
| 2004/0056329 | A1 * | 3/2004 | Maiz et al. | 257/618 |
| 2004/0175942 | A1 * | 9/2004 | Chang et al. | 438/689 |
| 2005/0106872 | A1 * | 5/2005 | Hong et al. | 438/689 |
| 2005/0184295 | A1 * | 8/2005 | Huang et al. | 257/77 |

FOREIGN PATENT DOCUMENTS

JP    409283018    * 10/1997

OTHER PUBLICATIONS

Ying Li & S. V. Babu, "Copper and Tantalum Chemical-Mechanical Planarisation: Some Recent Progress," Semiconductor Fabtech, 13th Edition, Mar. 2001, pp. 259-261.

* cited by examiner

*Primary Examiner*—Bradley K Smith
(74) *Attorney, Agent, or Firm*—Blakely, Sokoloff, Taylor & Zafman LLP

(57) ABSTRACT

Apparatus and methods of fabricating an interconnect in a dielectric material, such as by a damascene or dual damascene processes. In specific, with the use of a barrier layer, such as to contain copper-containing materials used in the fabrication of the interconnect, a slurry jet is used to remove the barrier layer without significantly damaging underlying dielectric material. Such a process is particularly useful when low-k dielectrics are used as the dielectric material, as low-k dielectrics can be easily damaged by known barrier layer removal techniques.

18 Claims, 16 Drawing Sheets

LOW STRESS BARRIER LAYER REMOVAL

BACKGROUND OF THE INVENTION

1. Field of the Invention

The present invention relates to barrier layer removal during the fabrication of microelectronic devices.

2. State of the Art

Microelectronic devices are comprised of a variety of discrete integrated circuits. These integrated circuits are generally connected to one another or to devices external to the microelectronic device by conductive traces or interconnects through which the discrete integrated circuits send or receive electronic signals.

One process used to form interconnects is known as a "damascene process". In a typical damascene process, a photoresist material is patterned on a dielectric material and the dielectric material is etched through the photoresist material patterning to form a channel or trench. The photoresist material is then removed (typically by an oxygen plasma) and trench is then filled, usually by deposition, with a conductive material (e.g., such as copper and alloys thereof). The resulting structure is planarized, usually by a technique called chemical mechanical polish (CMP), which removes the conductive material that is not within the trench from the surface of the dielectric material, to form the interconnect. As is understood by those skilled in the art, a hole or via may be formed in the dielectric material beneath the trench with a conductive material in the via to connect the interconnection to underlying integrated circuit devices or underlying interconnections. In another damascene process, known as a "dual damascene process", the trench and the via are substantially simultaneously filled with the conductive material with a single deposition.

As integrated circuits have become smaller and smaller, it has become necessary to use low dielectric constant (low-k) dielectric materials (i.e., dielectric materials with a dielectric constant below silicon dioxide) in the fabrication thereof in order to obtain low capacitance between the interconnects. Decreasing this capacitance between the interconnects results in several advantages, including reduced RC delay, reduced power dissipation, and reduced cross-talk between the interconnects. Low-k dielectric materials commonly used are carbon doped oxides (CDOs) or amorphous CDOs. CDOs tend to have a dielectric constant value less than 3.5, but suffer from weak mechanical properties. Therefore, planarization techniques, such as CMP, are generally not used with low-k dielectrics because the mechanical stresses from the planarization can result in damage to the low-k dielectrics during the fabrication of the interconnects.

Copper or copper-containing alloys are commonly used to form interconnects. However, copper can adversely affect the quality of microelectronic device, such as leakage current and reliability between the interconnects. As a result, a barrier layer is usually deposited between the dielectric material and the copper to act as a diffusion barrier. A typical material used for the barrier layer, particularly for copper interconnects, may include tantalum and tantalum nitride. However, tantalum containing barrier layers are not readily removed with stress-free or low-stress techniques, such as electrochemical techniques. Thus, the use of low-k dielectric and tantalum-containing barrier layers are substantially incompatible.

Therefore, it would be advantageous to develop apparatus and techniques to effectively remove barrier layer materials with a low stress removal process.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings to which:

DETAILED DESCRIPTION OF THE ILLUSTRATED EMBODIMENT

Figure 1:
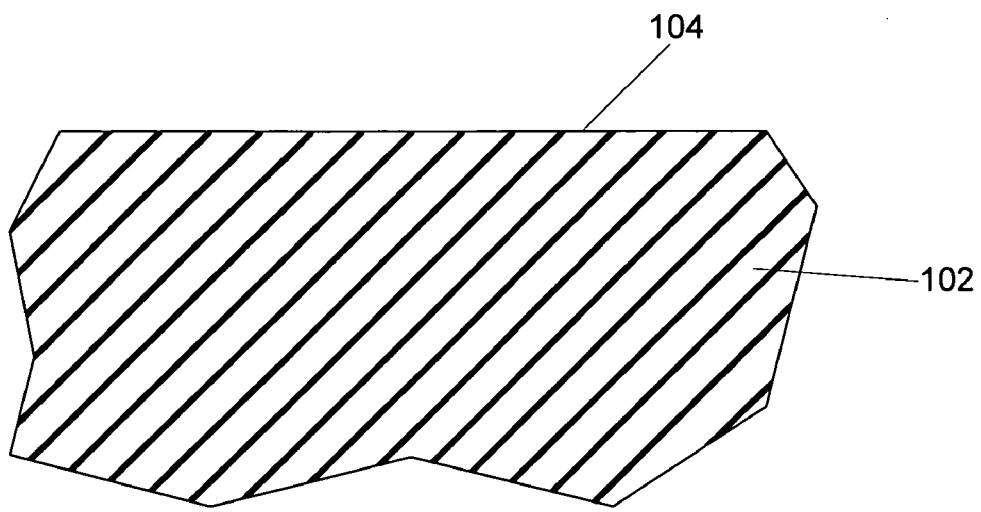
FIGS. 1-10 are side cross-sectional views of a process of forming an interconnect, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

It should be understood that embodiments of the present invention may be used in a variety of applications. Although the present invention is discussed in terms of microelectronic device fabrications, it is not limited in this respect. The material removal process and assemblies disclosed herein may be used in many apparatuses and applications.

Figure 2:
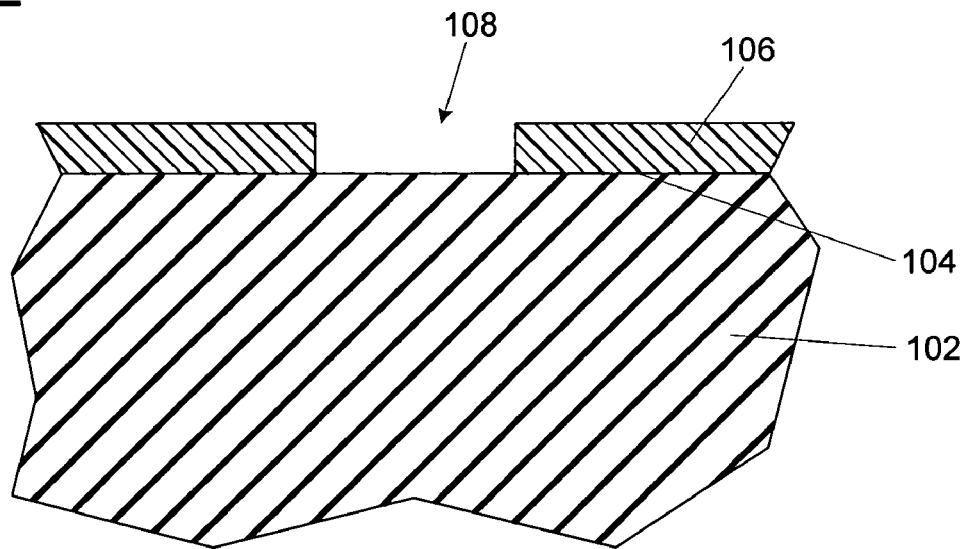
Figure 3:
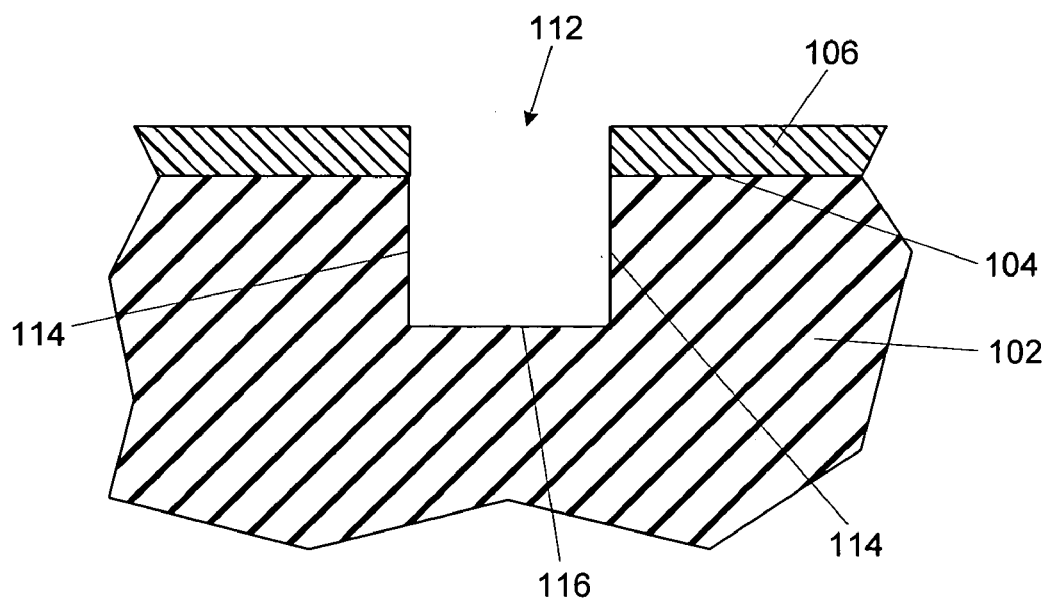
Figure 4:
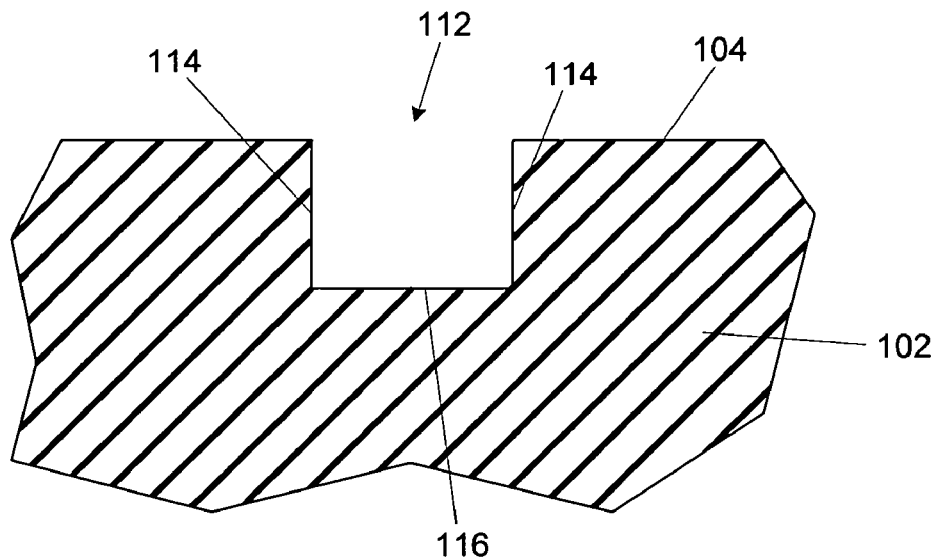

FIGS. 1-9 illustrate a damascene process for fabricating a microelectronic device according to one embodiment of the present invention. FIG. 1 illustrates a dielectric material 102, such as a low-k dielectric material, including but not limited to carbon doped oxides (CDOs), having a first surface 104. A photoresist material 106 is patterned, such as by photolithography as known in the art, on the dielectric material first surface 104 with at least one opening 108 therethrough, as shown in FIG. 2. The dielectric material 102 is then etched through the opening 108 to form a trench 112, comprising at least one side wall 114 and a bottom surface 116, extending into the dielectric material 102 from the dielectric material first surface 104, as shown in FIG. 3. As shown in FIG. 4, the photoresist material 106 is then removed, such as by an ashing process known in the art.

Figure 5:
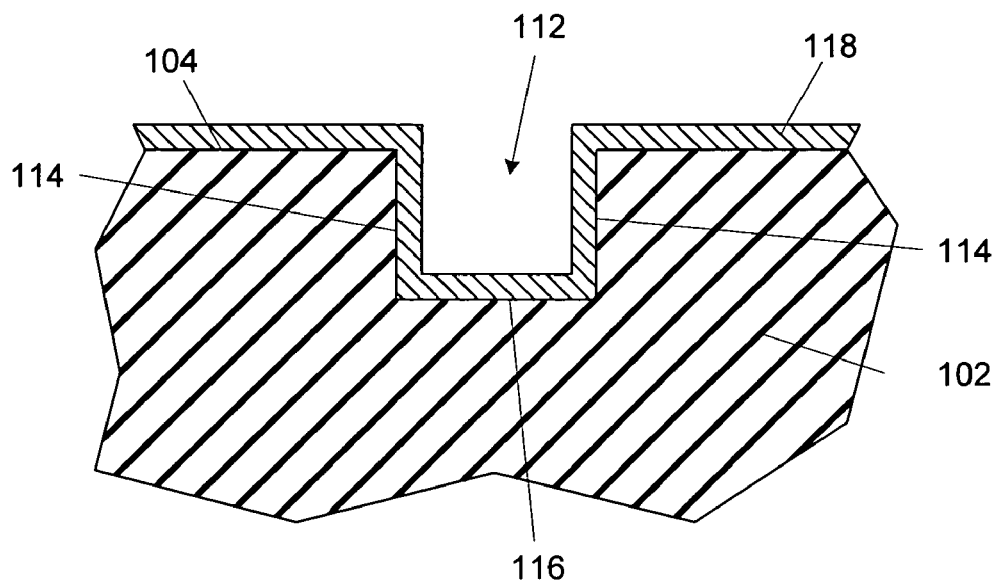

As shown in FIG. 5, a barrier layer 118 is substantially conformally deposited abutting the dielectric material first surface 104, the trench side wall(s) 114, and the trench bottom surface 116. In one embodiment, the barrier layer 118 is a material selected to inhibit the diffusion of an interconnect material (e.g., a copper-containing material) to be formed in the trench 112 from diffusing into the dielectric material 102. The barrier layer 118 may be deposited by any technique, including but not limited to chemical and physical deposition. Suitable materials for the barrier layer 118 includes, but are not limited to tantalum (Ta), tantalum nitride (TaN), titanium (Ti), titanium nitride (TiN), ruthenium (Ru), molybdenum (Mo), and niobium (Nb). The thickness of the barrier layer 118 should be sufficient to substantially prevent the diffusion of the interconnect material to be formed in the trench 112 and may be between about 1 and 20 nm thick.

Figure 6:
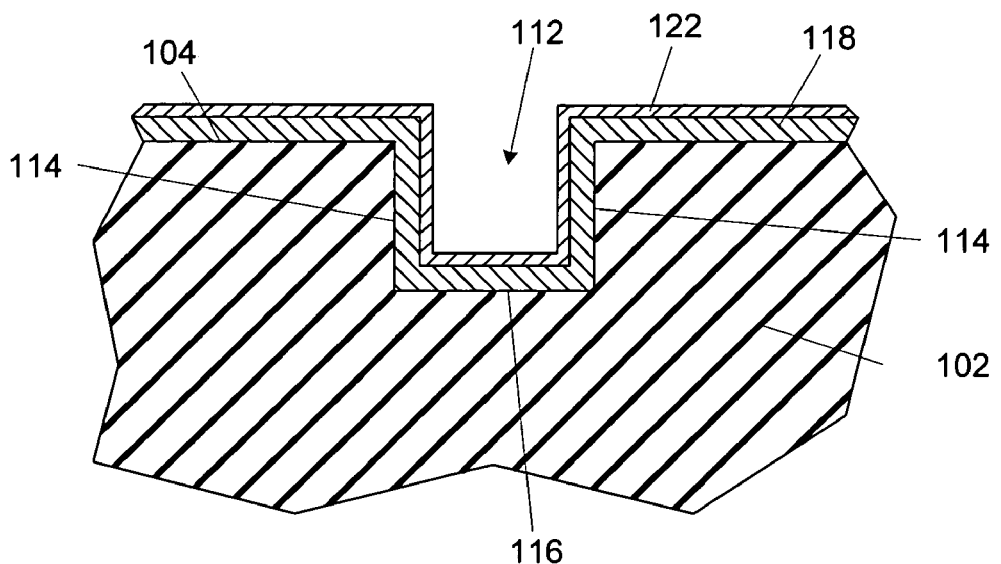

As shown in FIG. 6, a seed layer 122 may be deposited on the barrier layer 118, when an electroplating process will be used to form the interconnects. For an interconnect material comprising a copper-containing material, the deposited seed layer 122 is a material that will provide a surface to which the copper-containing material will plate. The seed layer 122 may be a copper-containing material deposited by chemical or physical deposition techniques to a thickness of less than about 3000 angstroms.

Figure 7:
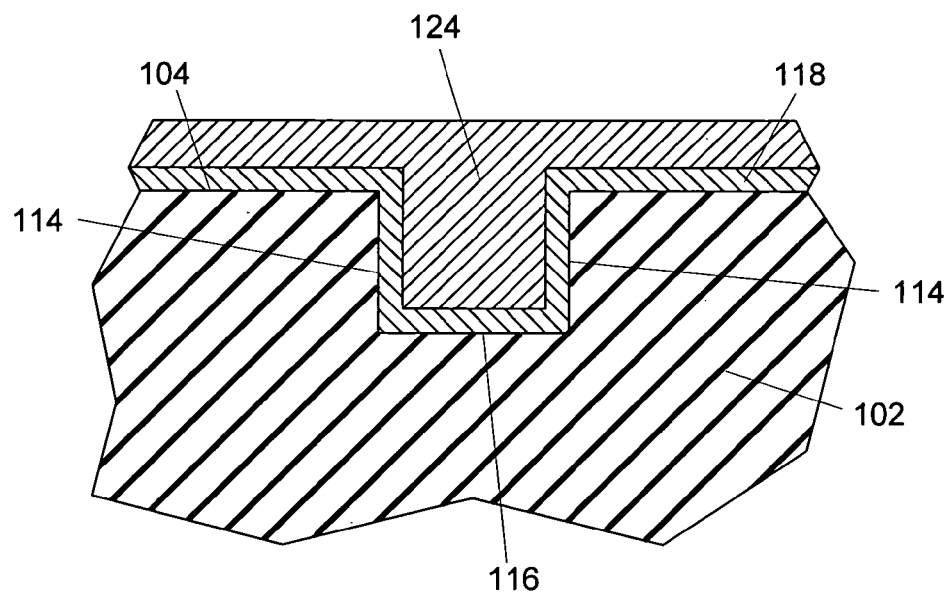

As shown in FIG. 7, a conductive material 124, such as a copper-containing material, is deposited within the trench 112, such as by an electroplating process. Suitable copper-containing materials include, but are not limited to, copper (Cu), copper-tin (CuSn), copper-indium (CuIn), copper-cadmium (CuCd), copper-bismuth (CuBi), copper-ruthenium (CuRu), copper-rhodium (CuRh), copper-rhenium (CuRe), and copper-tungsten (CuW). For example, a typical electroplating process involves placing a substrate (e.g., a microelectronic wafer) into an aqueous solution containing metal ions, such as a copper sulfate-based solution, and reducing the ions (reducing the oxidation number) to a metallic state by applying current between a substrate with seed material (seed layer 122) and an anode of an electroplating cell in the presence of the solution. As shown in FIG. 7, the conductive material 124 is deposited on the seed layer 122 to fill the trench 112 and deposit adjacent the dielectric layer first surface 104.

Figure 8:
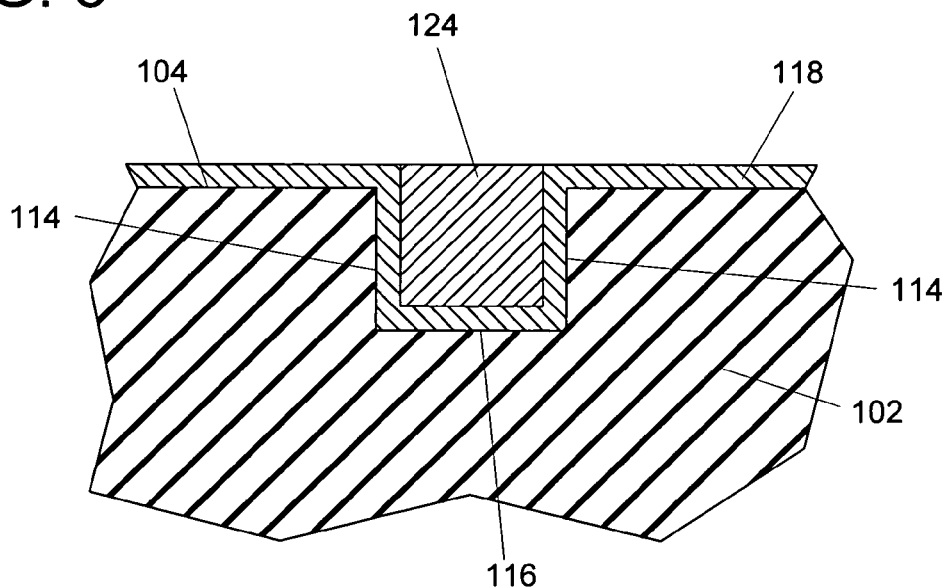

As shown in FIG. 8, the portion of the conductive material 124 adjacent the dielectric material first surface 104 is then removed to expose the barrier layer 118, by any known method, including but not limited to CMP (preferably high barrier layer selective), electropolishing, etching, and the like. The presence of the barrier layer 118 will strengthen the dielectric material 102 and provide protection from mechanical damage. If a CMP process with a highly selective copper clearing step is employed, most of the barrier layer 118 will remain to provide protection to the during the CMP step.

Figure 9:
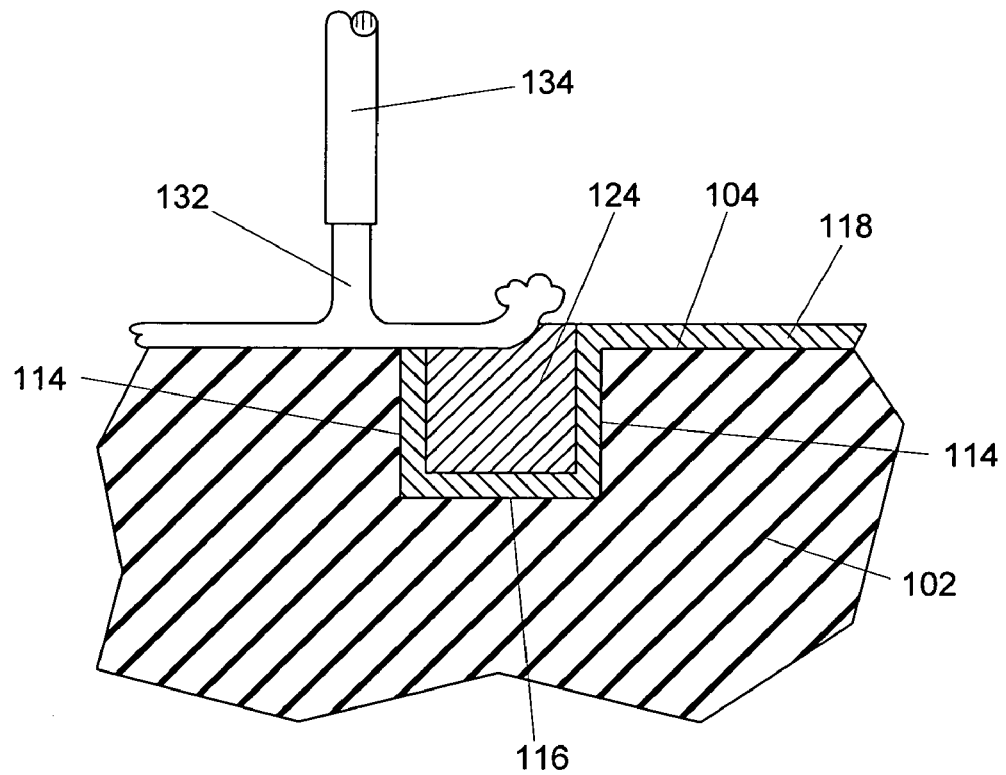
Figure 10:
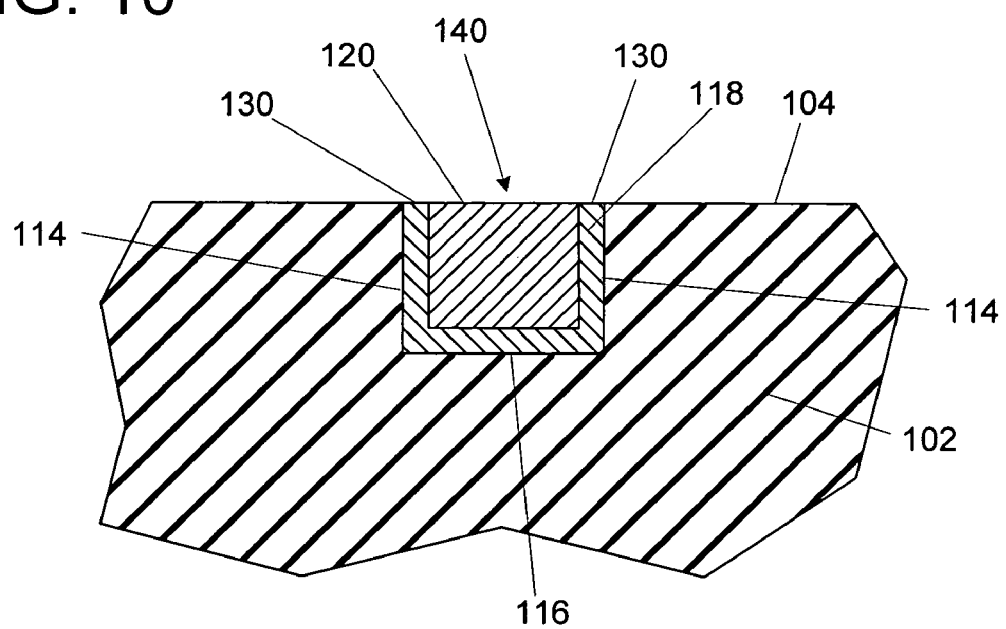

As shown in FIG. 9, the barrier layer 118 is removed with an abrasive slurry 132 delivered through at least one slurry jet 134 to expose the dielectric material first surface 104 and form at least one interconnect 140 (shown in FIG. 10). Preferably, a portion of the conductive material 124 is also removed during the removal of the barrier layer 118 such that a portion 120 of the conductive material 124 and a portion 130 of the barrier material are substantially planar with the dielectric material first surface 104, as shown in FIG. 10. Such a removal technique does not damage the dielectric material 102, as the fluid forces would not be able to able to transmit focused point forces, as exist in CMP, to the dielectric material 102. This is, of course, particularly important when fragile low-k dielectric materials are used as the dielectric material 102 As one skilled in the art will understand, a variety of abrasive materials, carrier liquids, delivery pressures, additives, and slurry jets can be selected and tuned depending on a specific barrier layer 118 material and conductive material 124 for appropriate removal thereof.

In one embodiment, an abrasive material, such as silica (e.g., fumed powder or colloidal suspension) is dispersed in a carrier liquid, such as ultrapure deionized water, to form the abrasive slurry 132. The abrasive slurry 132 may further include materials to assist in an effective removal of the barrier layer 118 and the conductive material 124. For example with copper as the conductive material 124 and tantalum as the barrier layer 118, hydrogen peroxide ($H_2O_2$) may be added to tune the removal rate of the tantalum to substantially the same removal rate as the copper. Thus, the remaining copper (conductive material 124) and tantalum (barrier layer 118) will be substantially planar to the dielectric material first surface 104. The abrasive slurry 132 may also include materials to assist in inhibiting corrosion of the conductive material 124. For example with copper as the conductive material 124, corrosion inhibitors such as benzotriazole, 2-mercaptobenzimidazole, 2-mercaptobenzothiazole, 2-mercaptobenzoxazole, 5,6-dimethylbenzimidazole, and the like, may be utilized. Furthermore, in one embodiment, the pH of the abrasive slurry 132 is above about 8.

It is, of course, understood that the slurryjet(s) 134 and the delivery of pressure of the abrasive slurry 132 could be tuned to deliver just the minimum particle momentum required for barrier removal. Furthermore, the particle size of the suspended abrasive material in the abrasive slurry 132 can also be tuned to achieve proper barrier layer 118 removal. In one embodiment wherein silica is utilized as the abrasive material, the silica size can range from between about 3 nm and 1 micron.

Figure 11A:
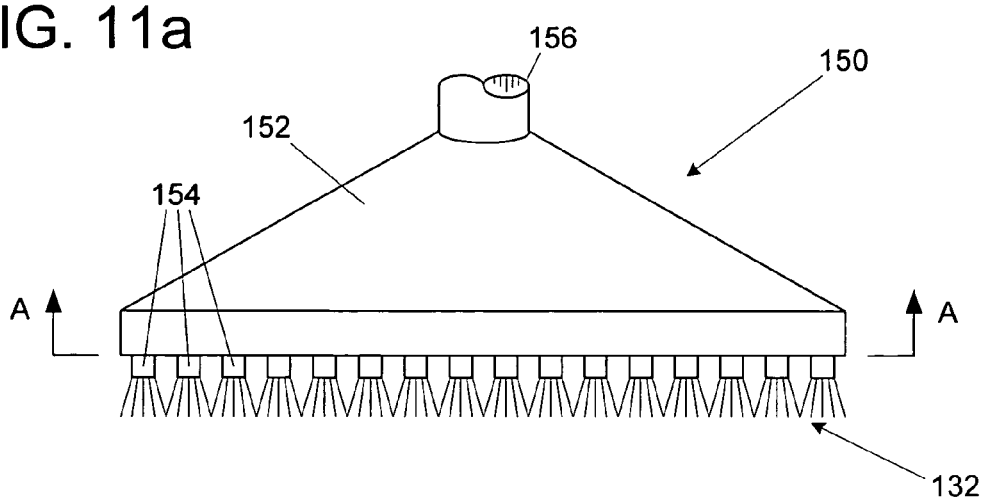
FIGS. 11a-c and 12-a-b are various views of slurryjet assemblies.
Figure 11B:
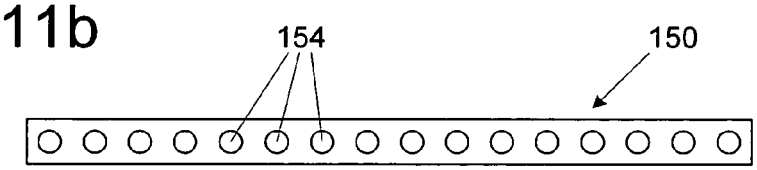
Figure 11C:
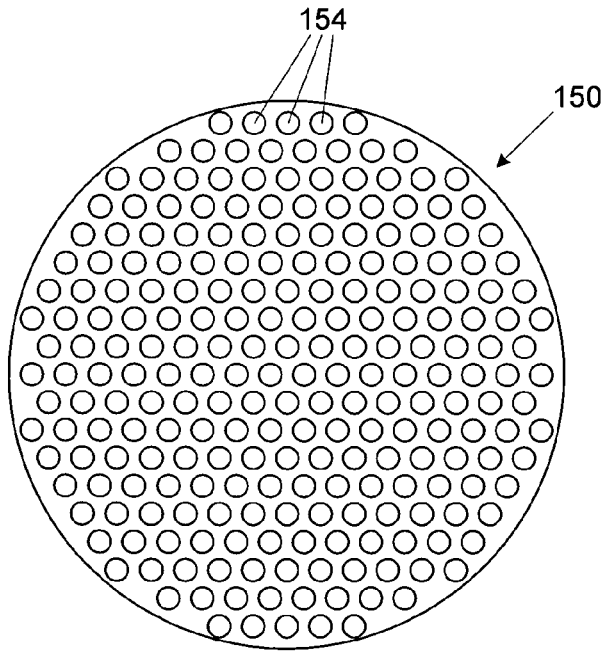
Figure 12A:
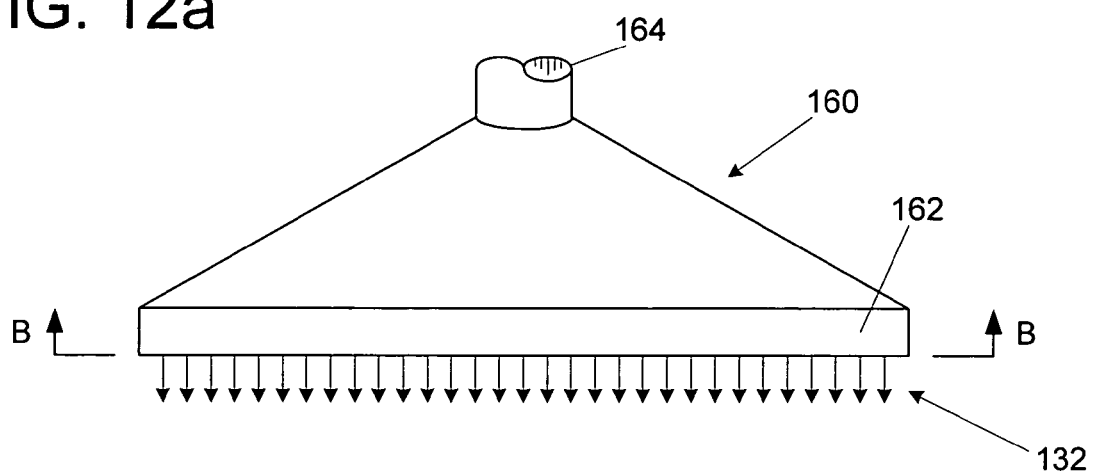
Figure 12B:
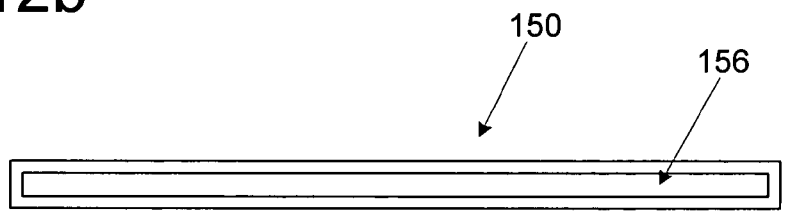

As will be understood to those skilled in the art, the slurry jet(s) may take on a variety of shapes and configurations. For example, as shown in the FIG. 11a, a plurality of slurry jets 154 can be connected to a slurry distribution chamber 152 having a slurry inlet 156 opposing the slurry jets 154 forming a slurryjet assembly 150. The slurry jets 154 can be aligned in a row (e.g., to extend across a wafer), such as shown in FIG. 11b. The slurry jets 154 can also be aligned in a "shower head" configuration as shown in FIG. 11c (e.g., cover the entire wafer). Furthermore, FIGS. 12a and 12b illustrate another example of a slurry jet assembly 160 comprising an elongate slit 166 (see FIG. 12b) in a slurry distribution chamber 162 having a slurry inlet 164 opposing the elongate slit 166. It is, of course, understood that these configurations are mere examples of a myriad of possible configurations.

Figure 13:
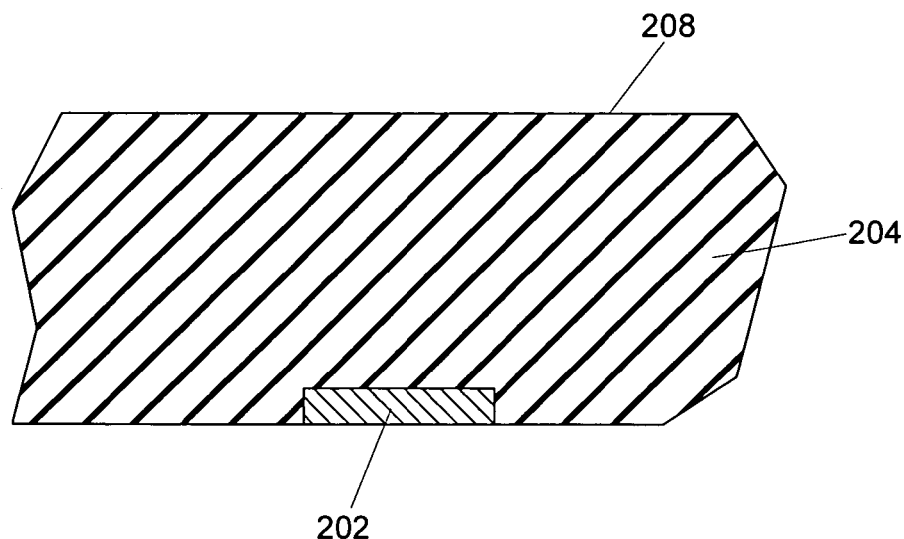
FIGS. 13-27 are side cross-sectional views of another process of forming an interconnect, according to the present invention.

FIGS. 13-26 illustrate a dual damascene process for fabricating a microelectronic device according to one embodiment of the present invention. FIG. 13 illustrates a conductive element 202 within at least one dielectric material 204, such as a low-k dielectric material, including but not limited to carbon doped oxides (CDOs). It is, of course, understood that the conductive element may include, but is not limited to, a conductive interconnect, a transistor gate, a transistor source, a transistor drain, and the like.

Figure 14:
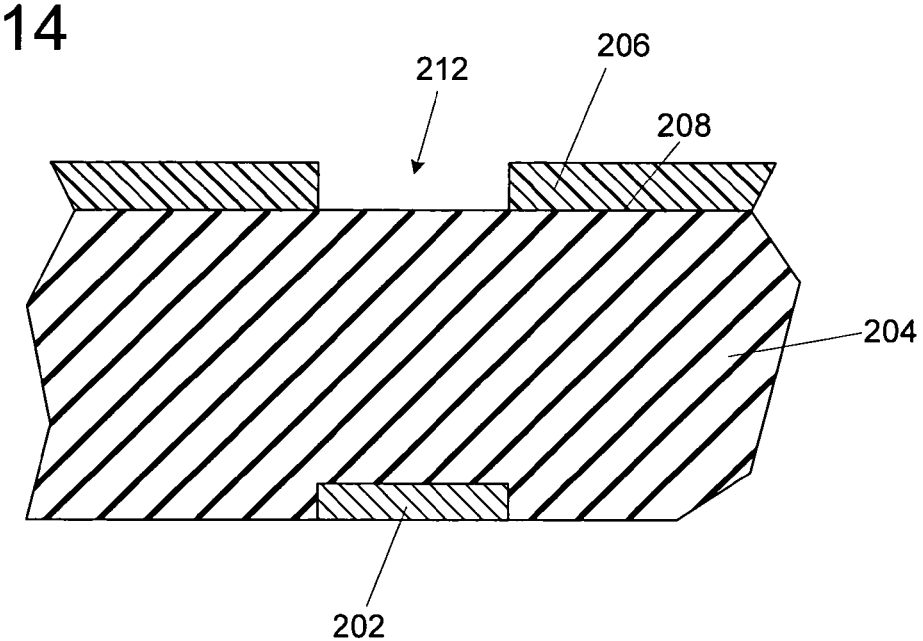
Figure 15:
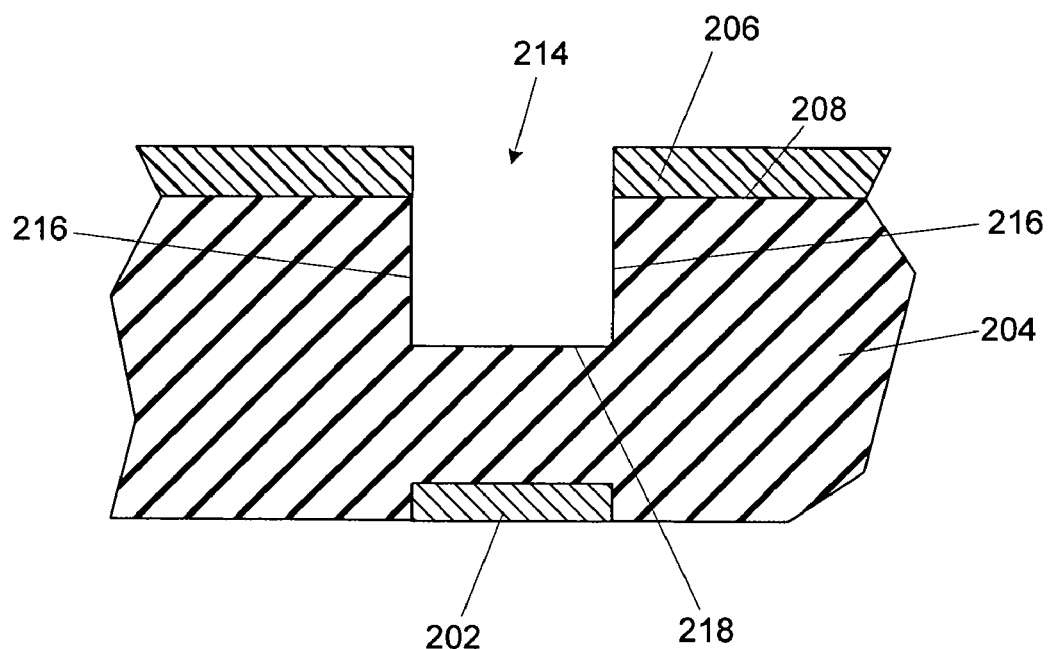
Figure 16:
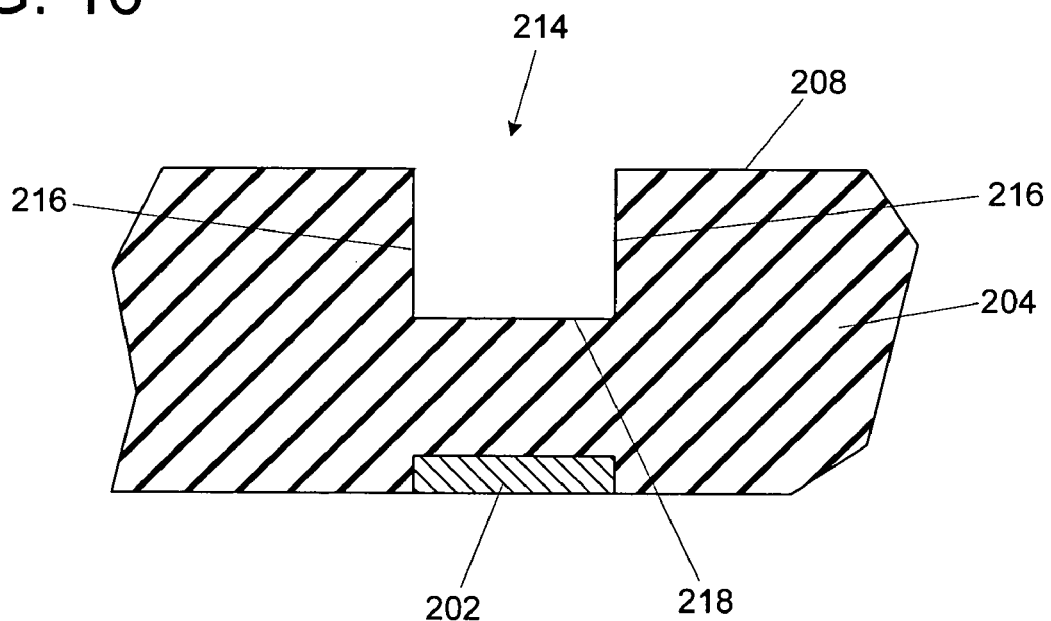

A first photoresist material 206 is patterned, such as by photolithography as known in the art, on a first surface 208 of the dielectric material 204 with at least one opening 212 therethrough, as shown in FIG. 14. The dielectric material 204 is then etched through the opening 212 to form a trench 214, comprising at least one side wall 216 and a bottom surface 218, extending into the dielectric material 204 from the dielectric material first surface 208, as shown in FIG. 15. As shown in FIG. 16, the first photoresist material 206 is then removed, such as by an ashing process known in the art.

Figure 17:
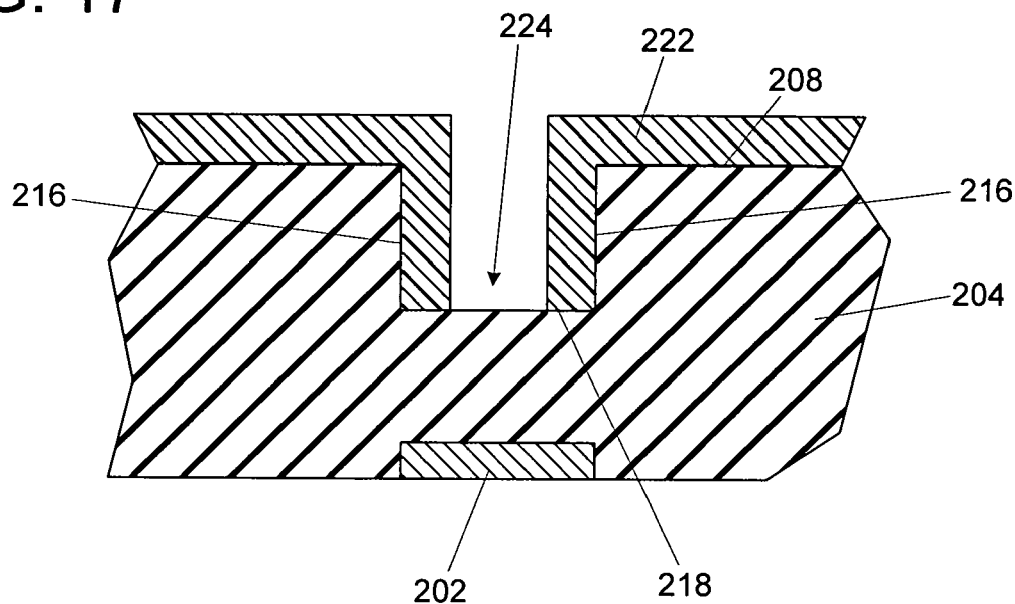
Figure 18:
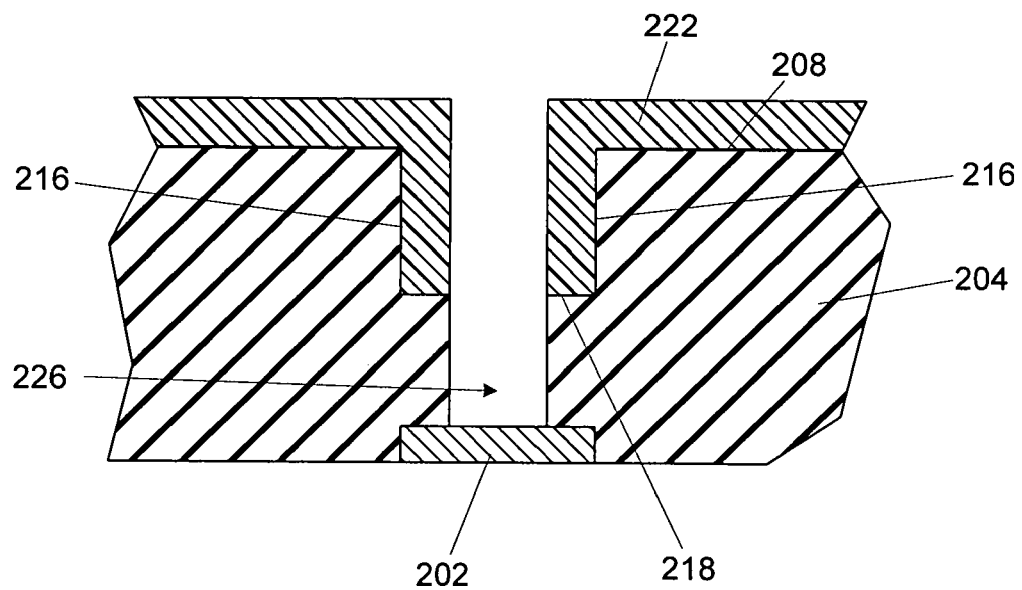
Figure 19:
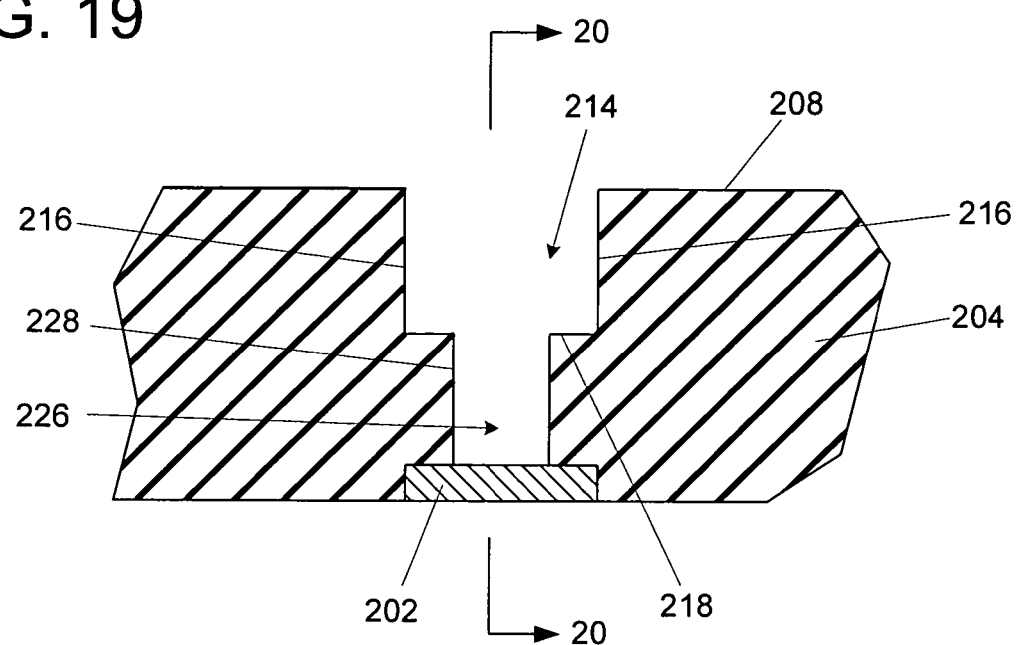
Figure 20:
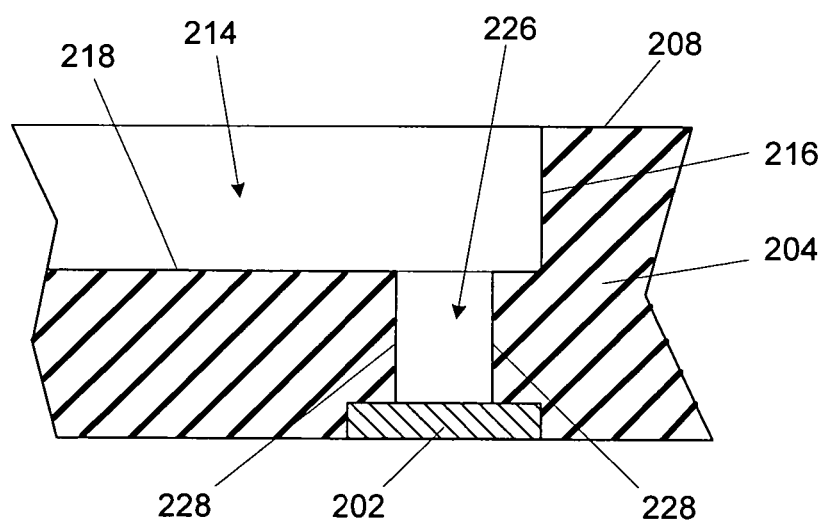

As shown in FIG. 17, a second photoresist material 222 is patterned, such as by photolithography as known in the art, on the dielectric material first surface 208 and may be partially within the trench 214 (see FIG. 16), with at least one opening 224 therethrough within the trench 214. The dielectric material 204 is then etched through the opening 224 to form a hole 226, comprising at least one side wall 228, extending through the dielectric material 204 from the trench bottom surface 218 to the conductive element 202, as shown in FIG. 18. As shown in FIGS. 19 and 20 (cross-section view along line 20-20 of FIG. 19), the second photoresist material 222 is then removed, such as by an ashing process known in the art.

Figure 21:
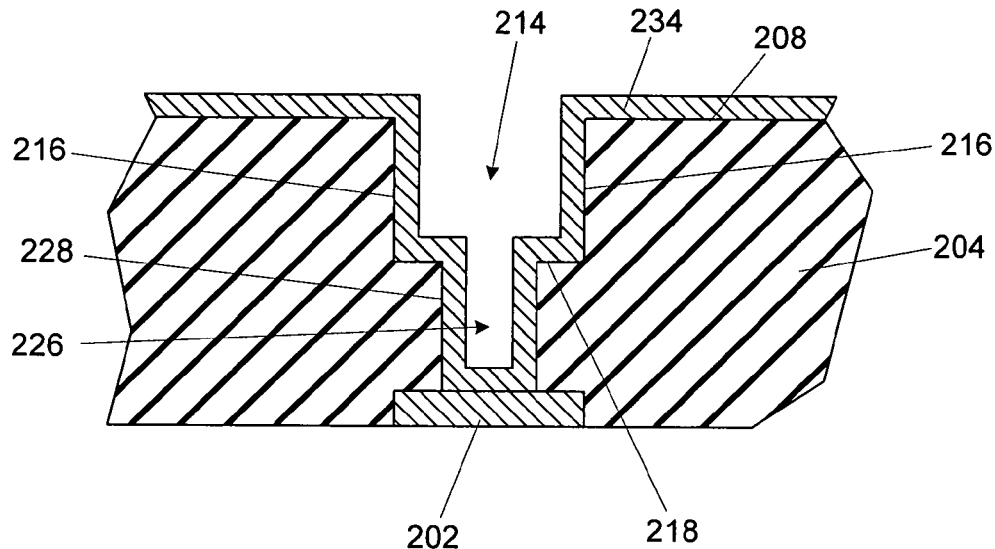
Figure 22:
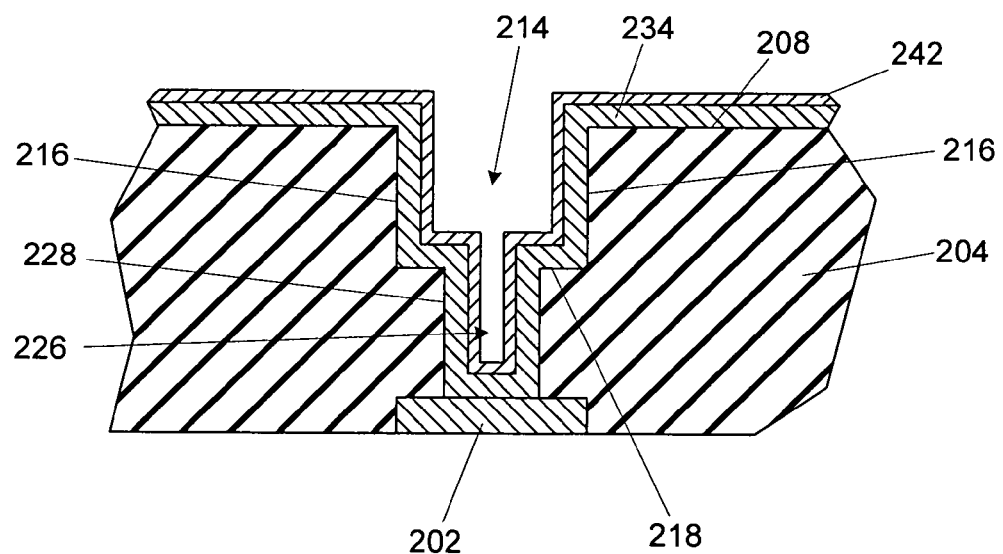
Figure 23:
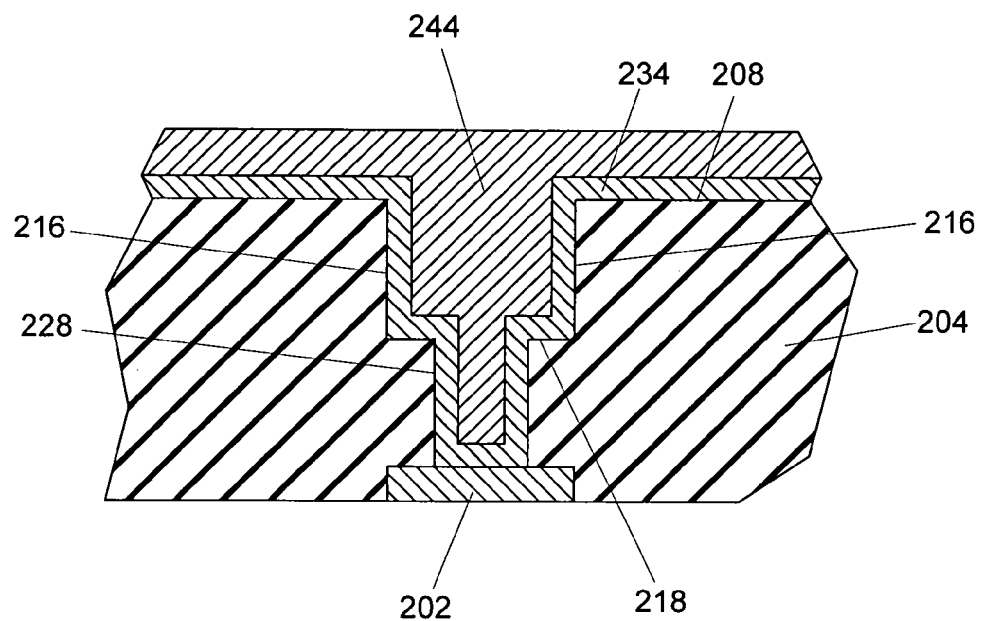

As shown in FIG. 21, a barrier layer 234 is substantially conformally deposited abutting the dielectric material first surface 208, the trench sidewall(s) 216, the trench bottom surface 218, the hole side sidewall(s) 228, and a portion of the conductive element 202, as previously discussed. As shown in FIG. 22, a seed layer 242 may be deposited on the barrier layer 234, when an electroplating process will be used to form the interconnects. As shown in FIG. 23, the conductive material 244 such as copper or copper alloy, is deposited on the seed layer 242 to fill the trench 214 and the hole 226 and deposit adjacent the dielectric material first surface 208, such as by an electroplating process, as previously discussed.

Figure 24:
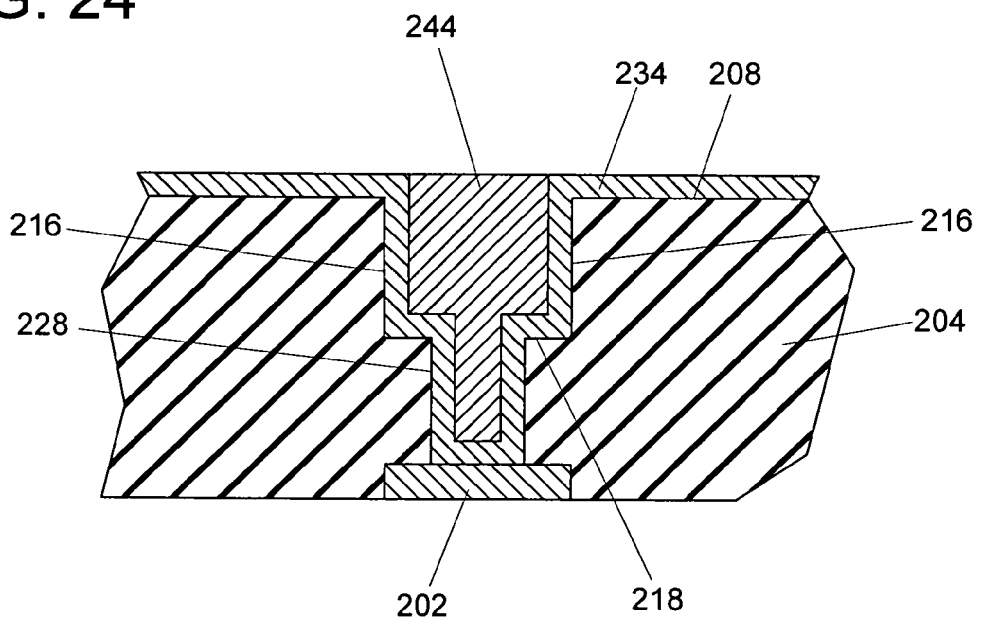

As shown in FIG. 24, the portion of the conductive material 244 adjacent the dielectric material first surface 208 is then removed to expose the barrier layer 234, as previously discussed. Again, the presence of the barrier layer 234 will strengthen the dielectric material 204 and provide protection from mechanical damage. If a CMP process with a highly selective copper clearing step is employed, most of the barrier layer 234 will remain to provide protection to the during the CMP step.

Figure 25:
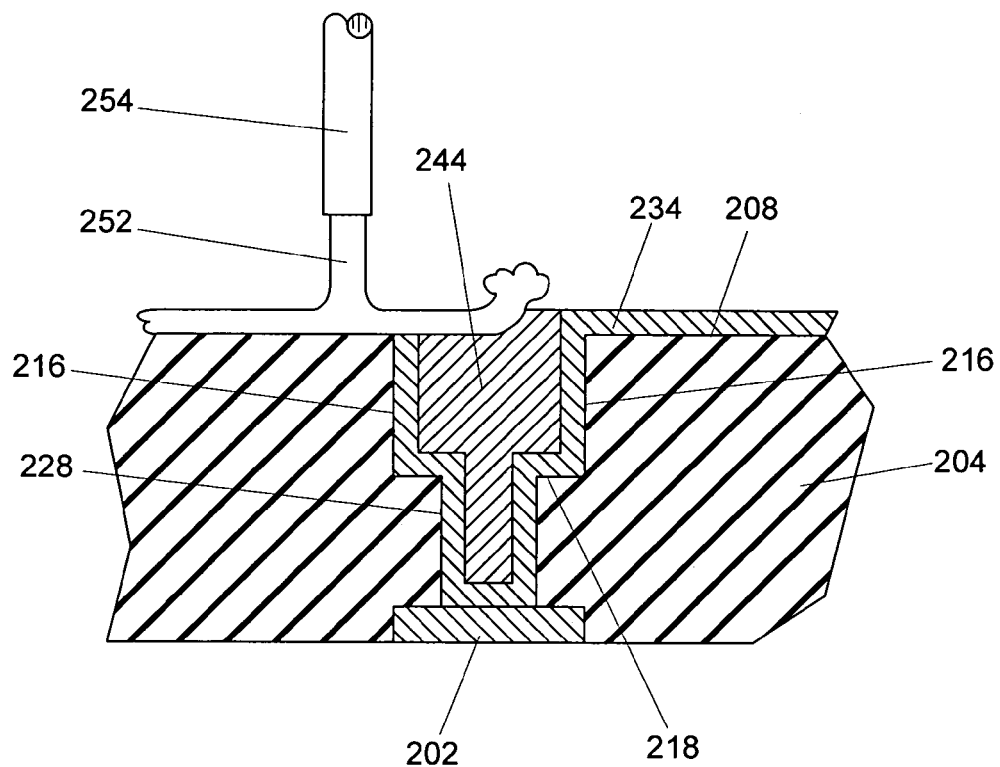
Figure 26:
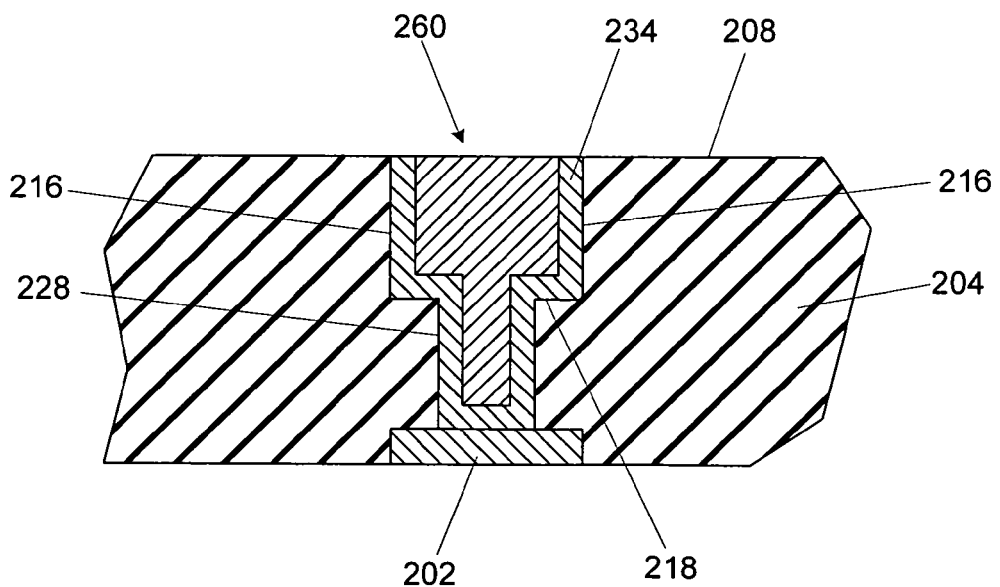

As shown in FIG. 25, the barrier layer 234 is removed with an abrasive slurry 252 delivered through at least one slurry jet 254 to expose the dielectric material first surface 208 and form an interconnect 260 (shown in FIG. 26). Such a removal technique does not damage the dielectric material 204, as the fluid forces would not be able to able to transmit focused point forces to the dielectric material 204.

Figure 27:
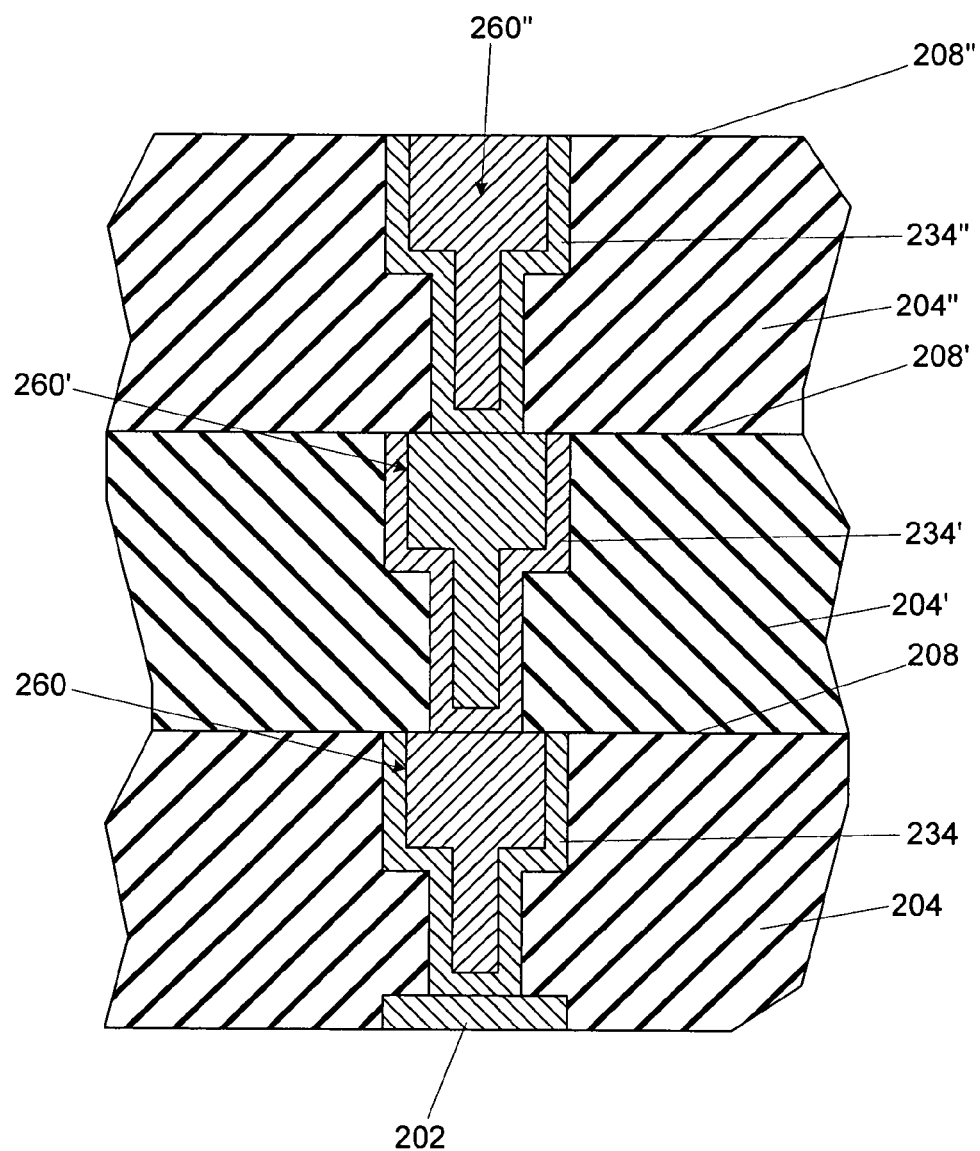

As shown in FIG. 27, the process of the present invention can be used to form multiple interconnect layers, as will be understood to those skilled in the art. In FIG. 27, similar stacked elements are distinguish by ' and ''. The dielectric material is designated as 204 in the first layer, 204' in the second layer, and 204'' in the third layer. The dielectric material layer first surface is designated as 208 in the first layer, 208' in the second layer, and 208'' in the third layer. The barrier layer is designated as 234 in the first layer, 234' in the second layer, and 234'' in the third layer. The interconnect is designated as 260 in the first layer, 260' in the second layer, and 260'' in the third layer.

Figure 28:
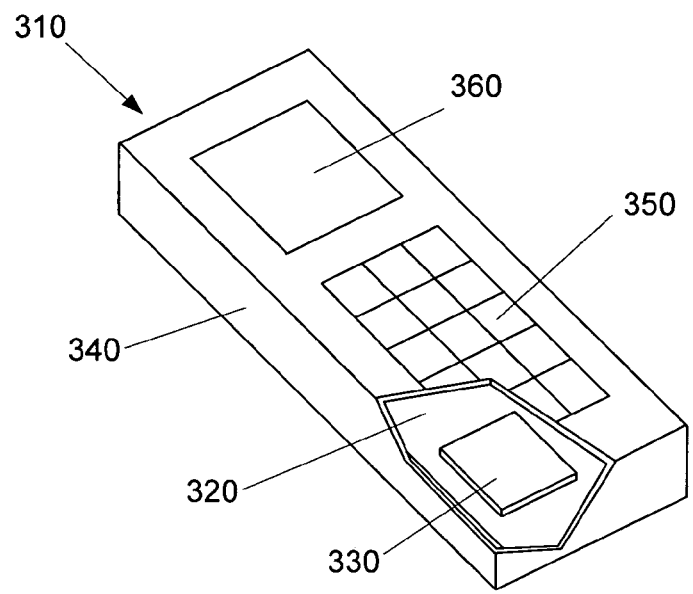
FIG. 28 is an oblique view of a hand-held device having a microelectronic assembly of the present integrated therein, according to the present invention.

The packages formed by the present invention may be used in a hand-held device 310, such as a cell phone or a personal data assistant (PDA), as shown in FIG. 28. The hand-held device 310 may comprise an external substrate 320 with at least one of the microelectronic device assembly 330, including but not limited to, a central processing units (CPUs), chipsets, memory devices, ASICs, and the like, having at least one interconnect as described above, such as the interconnect 140 of FIG. 10 or the interconnect 260 of FIG. 27, within a housing 340. The external substrate 320 may be attached to various peripheral devices including an input device, such as keypad 350, and a display device, such an LCD display 360.

Figure 29:
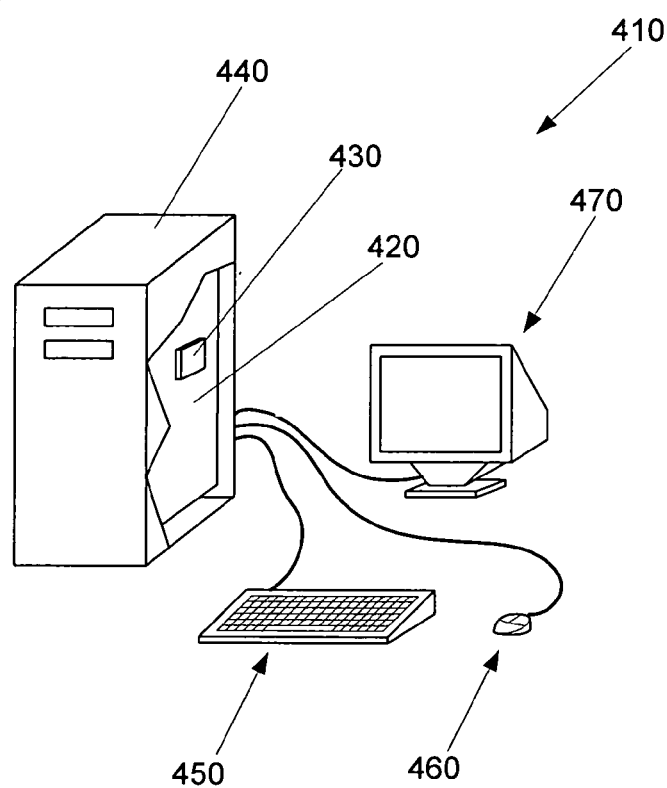
FIG. 29 is an oblique view of a computer system having a microelectronic assembly of the present integrated therein, according to the present invention.

The microelectronic device assemblies formed by the present invention may also be used in a computer system 410, as shown in FIG. 29. The computer system 410 may comprise an external substrate or motherboard 420 with at least one of the microelectronic device assembly 430, including but not limited to, a central processing units (CPUs), chipsets, memory devices, ASICs, and the like, having at least one interconnect as described above, such as the interconnect 140 of FIG. 10 or the interconnect 260 of FIG. 27, within a housing or chassis 440. The external substrate or motherboard 420 may be attached to various peripheral devices including inputs devices, such as a keyboard 450 and/or a mouse 460, and a display device, such as a CRT monitor 470.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method comprising,
   providing a barrier layer on a carbon doped oxide; and
   removing at least a portion of the barrier layer by streaming an abrasive slurry onto the barrier layer, wherein said abrasive slurry is delivered at a pressure to effectuate said barrier layer removal.

2. A method comprising,
   providing a barrier layer on a dielectric material; and
   removing at least a portion of the barrier layer by streaming an abrasive material within a carrier liquid onto the barrier layer, wherein said abrasive slurry is delivered at a pressure to effectuate said barrier layer removal.

3. The method of claim 2, wherein removing at least a portion of the barrier layer by streaming the abrasive material within the carrier liquid comprises removing at least a portion of the barrier layer by streaming silica within the carrier liquid.

4. The method of claim 2, wherein removing at least a portion of the barrier layer by streaming the abrasive material within the carrier liquid comprises removing at least a portion of the barrier layer by streaming the abrasive material within deionized water.

5. A method, comprising:
   providing a dielectric material having a first surface;
   forming a trench within the dielectric material, the trench including at least one sidewall and a bottom surface;
   disposing a barrier layer on the dielectric material first surface, the trench sidewall, and the trench bottom surface;
   disposing a conductive material abutting the barrier layer;
   removing a portion of the conductive material to expose the barrier layer abutting the dielectric material first surface; and
   removing the barrier layer by streaming an abrasive slurry onto the barrier layer to expose the dielectric material first surface, wherein said abrasive slurry is delivered at a pressure to effectuate barrier layer removal.

6. The method of claim 5, wherein disposing the barrier layer on the dielectric material includes disposing a barrier layer selected from the group comprising tantalum (Ta), tantalum nitride (TaN), titanium (Ti), titanium nitride (TiN), ruthenium (Ru), molybdenum (Mo), or niobium (Nb).

7. The method of claim 5, wherein disposing the barrier layer on the dielectric material includes disposing the barrier layer on a low-k dielectric material.

8. The method of claim 7, wherein disposing the barrier layer on the low-k dielectric material comprises disposing the barrier layer on a carbon doped oxide.

9. The method of claim 5, wherein removing at least a portion of the barrier layer by streaming the abrasive slurry onto the barrier layer comprises removing at least a portion of the barrier layer by streaming the abrasive material within a carrier liquid.

10. The method of claim 9, wherein removing at least a portion of the barrier layer by streaming the abrasive material within the carrier liquid comprises removing at least a portion of the barrier layer by streaming silica within the carrier liquid.

11. The method of claim 9, wherein removing at least a portion of the barrier layer by streaming the abrasive material within the carrier liquid comprises removing at least a portion of the barrier layer by streaming the abrasive material within deionized water.

12. A method, comprising:
providing a dielectric material having a first surface and a conductive element therein;
forming a trench within the dielectric material, the trench including at least one sidewall and a bottom surface;
forming a hole extending into the dielectric material from the trench bottom surface to the conductive element;
disposing a barrier layer on the dielectric material first surface, the at least one trench sidewall, the trench bottom surface, the at least one hole sidewall, and the conductive element;
disposing a conductive material abutting the barrier layer;
removing a portion of the conductive material to expose the barrier layer abutting the dielectric material first surface; and
removing the barrier layer by streaming an abrasive slurry onto the barrier layer to expose the dielectric material first surface, wherein said abrasive slurry is delivered at a pressure to effectuate barrier layer removal.

13. The method of claim 12, wherein disposing the barrier layer on the dielectric material includes disposing a barrier layer selected from the group comprising tantalum (Ta), tantalum nitride (TaN), titanium (Ti), titanium nitride (TiN), ruthenium (Ru), molybdenum (Mo), or niobium (Nb).

14. The method of claim 12, wherein disposing the barrier layer on the dielectric material includes disposing the barrier layer on a low-k dielectric material.

15. The method of claim 14, wherein disposing the barrier layer on the low-k dielectric material comprises disposing the barrier layer on a carbon doped oxide.

16. The method of claim 12, wherein removing the portion of the barrier layer by streaming an abrasive slurry onto the barrier layer comprises removing the portion of the barrier layer by streaming an abrasive material within a carrier liquid.

17. The method of claim 16, wherein removing a portion of the barrier layer by streaming an abrasive material within a carrier liquid comprises removing a portion of the barrier layer by streaming silica within the carrier liquid.

18. The method of claim 16, wherein removing a portion of the barrier layer by streaming an abrasive material within a carrier liquid comprises removing a portion of the barrier layer by streaming the abrasive material within deionized water.

* * * * *